(12) United States Patent
Sato et al.

(10) Patent No.: US 8,779,297 B2
(45) Date of Patent: Jul. 15, 2014

(54) HEAT RELEASE DEVICE

(75) Inventors: Shinya Sato, Kariya (JP); Hiroshi Fukasaku, Kariya (JP)

(73) Assignee: Kabushiki Kaisha Toyota Jidoshokki, Kariya-Shi (JP)

( * ) Notice: Subject to any disclaimer, the term of this patent is extended or adjusted under 35 U.S.C. 154(b) by 121 days.

(21) Appl. No.: 13/482,495

(22) Filed: May 29, 2012

(65) Prior Publication Data

US 2012/0314375 A1 Dec. 13, 2012

(30) Foreign Application Priority Data

Jun. 9, 2011 (JP) ................. 2011-128830

(51) Int. Cl.
*H05K 1/00* (2006.01)
*H05K 1/02* (2006.01)

(52) U.S. Cl.
CPC .... *H05K 1/0204* (2013.01); *H05K 2201/10303* (2013.01); *H05K 2201/10409* (2013.01); *H05K 1/0218* (2013.01)
USPC .......................................... 174/252; 174/260

(58) Field of Classification Search
CPC .............. H05K 1/0204; H05K 1/0218; H05K 2201/10409; H05K 2201/10303
See application file for complete search history.

(56) References Cited

U.S. PATENT DOCUMENTS

| | | | |
|---|---|---|---|
| 5,339,519 A | | 8/1994 | Fortune |
| 5,392,197 A | * | 2/1995 | Cuntz et al. .................... 361/818 |
| 6,303,989 B1 | * | 10/2001 | Yasuho et al. ................. 257/706 |
| 6,418,021 B1 | * | 7/2002 | Itabashi et al. ................ 361/704 |

| | | | |
|---|---|---|---|
| 2004/0136162 A1 | | 7/2004 | Asai et al. |
| 2009/0002950 A1 | | 1/2009 | Gertiser et al. |
| 2009/0040727 A1 | | 2/2009 | Decker |
| 2010/0246139 A1 | | 9/2010 | Suzuki et al. |

FOREIGN PATENT DOCUMENTS

| | | |
|---|---|---|
| DE | 19723409 A1 | 12/1998 |
| DE | 10354202 A1 | 6/2004 |
| DE | 102007037297 A1 | 2/2009 |
| EP | 0717443 A1 | 6/1996 |
| JP | H10-150283 A | 6/1998 |
| JP | 11-026955 A | 1/1999 |
| JP | 2001-230580 A | 8/2001 |
| JP | 2002-151634 A | 5/2002 |
| JP | 2004-172459 A | 6/2004 |
| JP | 2008-283154 A | 11/2008 |

(Continued)

OTHER PUBLICATIONS

German Office Action with English translation for German Paten Application No. 10 2012 209 641.8 mailed on Aug. 19, 2013.

*Primary Examiner* — Ishwarbhai B Patel
(74) *Attorney, Agent, or Firm* — Yoshida & Associates, LLC

(57) ABSTRACT

A heat release device is for use with a multilayer board that has an inner layer serving as a power layer. The heat release device includes a heat release member thermally and electrically connected to the power layer, and a heat release board having a heat release layer and a shield layer electrically insulated from each other. The heat release layer is thermally and electrically connected to the heat release member. The shield layer serves to shield against electromagnetic noise radiated from the heat release layer. The shield layer is electrically insulated from the heat release member connected to the heat release layer. The heat release device also includes an electrically conductive member electrically connected to the shield layer and grounded, and an insulator through which the heat release layer is thermally connected to the electrically conductive member.

2 Claims, 1 Drawing Sheet

(56) References Cited

FOREIGN PATENT DOCUMENTS

| JP | 2010-103368 A | 5/2010 |
| JP | 2010-103371 A | 5/2010 |
| JP | 2010-232318 A | 10/2010 |

* cited by examiner

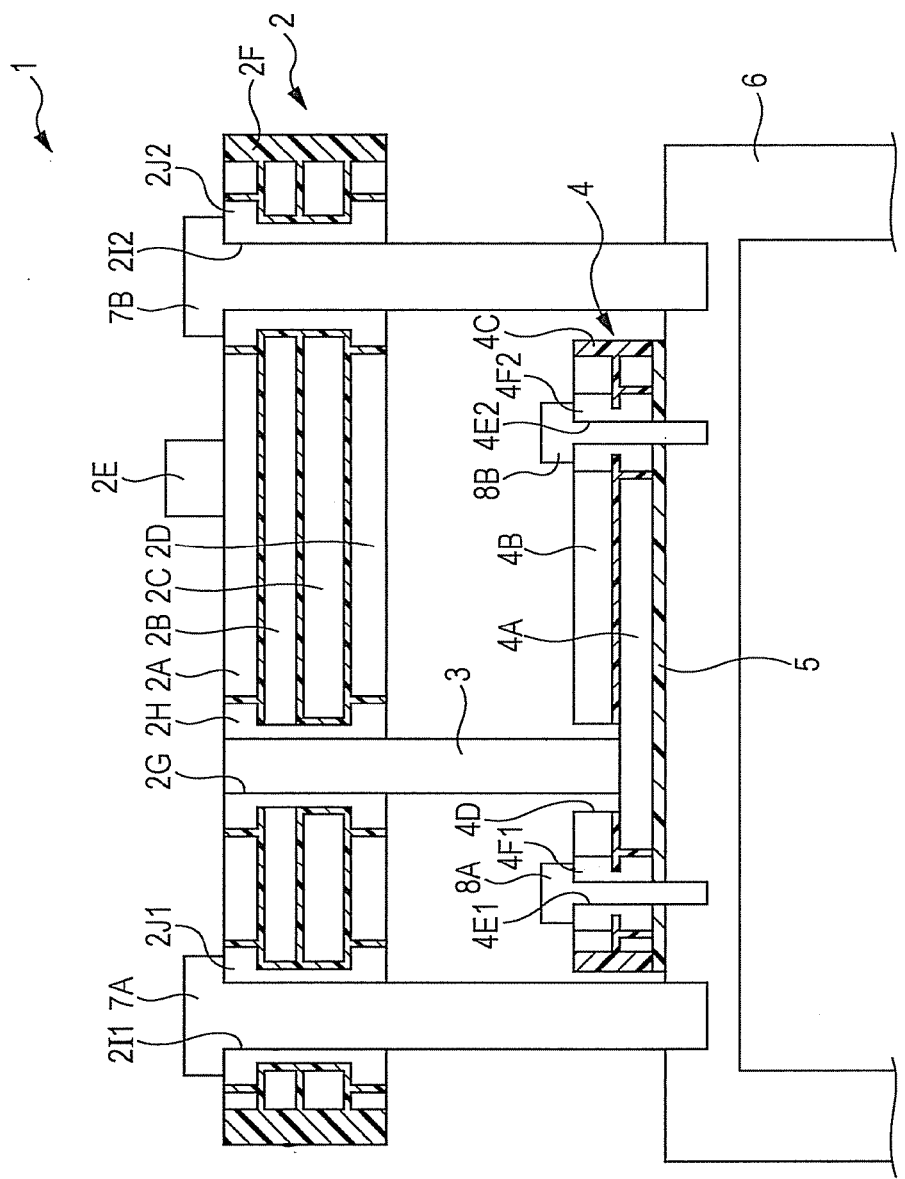

HEAT RELEASE DEVICE

BACKGROUND OF THE INVENTION

The present invention relates to a heat release device for use with a printed circuit board on which electrical components are mounted.

There are known various methods for release of heat generated in a printed circuit board on which electric components are mounted. In one example disclosed in Japanese Unexamined Patent Application Publication No. 2004-172459, a multilayer printed circuit board or multilayer board having upper, inner and lower conductive layers is housed in a closed casing. Holes are formed through the multilayer board at a position where an electric component is mounted on the board so that the heat generated in the electric component is transferred from the upper conductive layer through the holes to the inner and lower conductive layers of the board. The upper, inner and lower conductive layers of the board are thermally connected to a heat conductive terminal through which the heat is released out of the casing into the surrounding air.

In another example disclosed in Japanese Unexamined Patent Application Publication No. 2010-103371, a printed circuit board having thereon a heat generating component is housed in a casing. Heat is transferred from the heat generating component to the printed circuit board and then released to the casing through a press fit component that is press fit in the printed circuit board and also in contact with the casing.

There is known a multilayer printed circuit board the inner layer of which serves as a power layer. In such multilayer board, when a large current flows from the power layer to the electric component, for example, for driving an electric motor of a compressor, heat is generated in the power layer. Such heat is difficult to be released because the power layer is the inner layer of the multilayer board. If the heat has any influence on the operation of the electric component, the heat needs to be released out of the multilayer board.

Release of the heat generated in the power layer may be accomplished, for example, by combining two methods disclosed in the above-cited publications No. 2004-172459 and No. 2010-103371. Specifically, electrically connecting the power layer to the heat conductive terminal or to the press fit component provides efficient heat transfer and hence efficient heat release.

In such method, however, electromagnetic noise possibly affecting the operation of the electric component may be emitted from the heat conductive terminal or the press fit component electrically connected to the power layer.

The present invention is directed to providing a heat release device that allows release of the heat generated in the power layer of the multilayer board and also allows shielding the multilayer board against the electromagnetic noise occurring due to the heat release.

SUMMARY OF THE INVENTION

In accordance with an aspect of the present invention, a heat release device is for use with a multilayer board that has an inner layer serving as a power layer. The heat release device includes a heat release member thermally and electrically connected to the power layer, and a heat release board having a heat release layer and a shield layer electrically insulated from each other. The heat release layer is thermally and electrically connected to the heat release member. The shield layer serves to shield against electromagnetic noise radiated from the heat release layer. The shield layer is electrically insulated from the heat release member connected to the heat release layer. The heat release device also includes an electrically conductive member electrically connected to the shield layer and grounded, and an insulator through which the heat release layer is thermally connected to the electrically conductive member.

Other aspects and advantages of the invention will become apparent from the following description, taken in conjunction with the accompanying drawings, illustrating by way of example the principles of the invention.

BRIEF DESCRIPTION OF THE DRAWINGS

FIG. 1 is a schematic sectional view of an electric control unit including a heat release device according to an embodiment of the present invention.

DETAILED DESCRIPTION OF THE EMBODIMENTS

The following will describe the embodiment of the present invention with reference to the attached drawing. FIG. 1 is a schematic sectional view showing the embodiment of the heat release device included in an electronic control unit.

Referring to FIG. 1, the electronic control unit designated generally by 1 includes a multilayer printed circuit board or multilayer board 2, a heat release pin 3, a heat-release multilayer printed circuit board or heat release board 4, an insulator 5, and a casing 6. The multilayer board 2 is fixedly supported by the casing 6 through plural bolts such as 7A, 7B at a distance spaced away from the casing 6. The heat release board 4 is fixedly supported by the casing 6 through plural bolts such as 8A, 8B with the insulator 5 interposed between the heat release board 4 and the casing 6 in contact therewith. The heat release pin 3 as the heat release member of the present invention is connected at one end thereof to the multilayer board 2 and at the other end thereof to the heat release board 4.

The heat release pin 3, the casing 6, and the bolts 7A, 7B, 8A, 8B are made of an electrically conductive material. The Insulator 5 is made of an electrically insulating material having a good thermal conductivity and provided by a ceramic, a silicone grease, or insulating sheet.

The casing 6 as the electrically conductive member of the present invention is grounded, and for example a housing or an inverter cover. The multilayer board 2 has four layers including two inner layers, namely a power layer 2B and a ground layer 2C, and two outer layers, namely wiring layers 2A, 2D on which plural electric components designated by 2E (only one being shown in FIG. 1) are mounted, for example, for driving an electric motor of a compressor. The power layer 2B, the ground layer 2C and the wiring layers 2A, 2D are insulated from one another by an insulator 2F, except part necessary for electrical connection such as through holes (not shown). The lateral sides of the multilayer board 2 are also insulated by the insulator 2F.

The multilayer board 2 has a through hole 2G in which the heat release pin 3 is inserted. The through hole 2G has on the inner periphery thereof a conductive portion 2H that is made of, for example, copper. The conductive portion 2H is electrically connected to the power layer 2B, but electrically insulated from the ground layer 2C and the wiring layers 2A, 2D by the insulator 2F. The power layer 2B and the heat release pin 3 are electrically and thermally connected to each other through the conductive portion 2H for transferring heat from the power layer 2B to the heat release pin 3.

The multilayer board 2 has plural bolt holes 2I1, 2I2 in which the respective bolts 7A, 7B are inserted. The bolt holes 2I1, 2I2 have on the respective inner peripheries thereof conductive portions 2J1, 2J2 that are made of, for example, copper. The conductive portions 2J1, 2J2 are insulated from all of the four layers 2A, 2B, 2C and 2D by the insulator 2F.

The heat release board 4 has two layers, namely a heat release layer 4A and a shield layer 4B which are made of a conductive material such as copper. The heat release layer 4A and the shield layer 4B are insulated from each other by an insulator 4C. The lateral sides of the heat release board 4 are also insulated by the insulator 4C. The heat release layer 4A and the heat release pin 3 are electrically and thermally connected to each other for transferring heat from the heat release pin 3 to the heat release layer 4A. The shield layer 4B serves to shield against electromagnetic noise radiated from the heat release layer 4A.

The heat release board 4 has a hole 4D in which one end of the heat release pin 3 is inserted. The hole 4D is formed through the shield layer 4B and the insulator 4C and has a dimension that is large enough to provide a sufficient gap between the heat release pin 3 and the inner surface of the hole 4D so that the heat release pin 3 is insulated from the shield layer 4B.

The heat release board 4 has plural bolt holes 4E1, 4E2 through which the respective bolts 8A, 8B are inserted. The bolt holes 4E1, 4E2 have on the respective inner peripheries thereof conductive portions 4F1, 4F2 that are made of, for example, copper. The conductive portions 4F1, 4F2 are electrically connected to the shield layer 4B, but electrically insulated from the heat release layer 4A by the insulator 4C.

In the electronic control unit 1, the casing 6 is grounded. Thus, the bolts 7A, 7B, the conductive portions 2J1, 2J2, the bolts 8A, 8B, the conductive portions 4F1, 4F2 and the shield layer 4B which are all electrically connected to the casing 6 are also grounded.

In the above-described electric control unit 1, when a large current flows through the power layer 2B to the electric component 2E in the multilayer board 2, heat is generated in the power layer 2B. The heat is transferred through the conductive portion 2H of the through hole 2G and the heat release pin 3 to the heat release layer 4A of the heat release board 4. The heat is further transferred through the insulator 5 to the casing 6 and then radiated into the surrounding air. The insulator 5 is in contact with the heat release layer 4A and the casing 6 over a large area, thereby providing good heat radiation. The heat is transferred from the power layer 2B to the heat release layer 4A through the conductive portion 2H and the heat release pin 3 which are made of an electrically conductive material, thereby providing efficient heat transfer and hence good heat radiation. Thus, the heat generated in the power layer 2B gives little influence on the operation of the electric components mounted on the multilayer board 2.

Since the power layer 2B is thermally and electrically connected to the heat release layer 4A through the electrically conductive material, electromagnetic noise may be emitted from the heat release layer 4A. In the present embodiment, however, such noise is blocked by the shield layer 4B and hence gives little influence on the operation of the electric components mounted on the multilayer board 2. Shielding against the noise emitted from the heat release layer 4A is accomplished by one of the layers of the multilayer board, which requires no additional cover for shielding against the noise and, therefore, makes it easy to assemble the electronic control unit 1. Although electromagnetic noise may be emitted also from the heat release pin 3, the heat release pin 3 is made short enough to prevent such noise from affecting the operation of the electric components mounted on the multilayer board 2.

In the case that a refrigerant passage of an air conditioner is included in or located adjacent to the casing 6 in the electronic control unit 1, the casing 6 may be cooled by the refrigerant flowing through such passage, resulting in an increased heat radiation efficiency.

Part of the heat release pin 3 may have a bellows-like structure with an elasticity, which makes it easy to assemble the multilayer board 2 of the electronic control unit 1.

The heat release pin 3 may be plural. In this case, plural holes such as 2G are formed through the multilayer board 2, and plural holes such as 4D are provided in the heat release board 4. It is necessary, however, to determine the number of heat release pins 3 so that, for example, the electromagnetic noise radiated from the heat release pin 3 gives little influence on the electric components mounted on the multilayer board 2.

Connection between the power layer 2B and the heat release pin 3 may be accomplished not only by the through hole 2G, but also by a hole formed in the multilayer board 2, such as 2I1, 2I2, and having on the inner periphery thereof a conductive portion that is electrically connected only to the power layer 2B. The heat release pin 3 may be replaced by an electrically conductive heat release member in the form of a plate. In this case, the multilayer board 2 and the heat release board 4 need to have holes of a suitable size for receiving such plate-shaped heat release member, and the size and the shape of the heat release member needs to be determined so that the noise radiated from the heat release member gives little influence on the electric components mounted on the multilayer board 2.

The shield layer 4B which is grounded by the bolts 8A, 8B may be grounded in any other suitable manner. Grounding of the shield layer 4B may be accomplished, for example, by mounting an electrically conductive pin to the casing 6 and then inserting the pin into its associated hole formed in the heat release board 4 so that the pin is electrically connected only to the shield layer 4B.

The heat release board 4 may have an outer layer that replaces the insulator 5 provided between the heat release 4 and the casing 6. In other words, the insulator 5 may be formed as an outer layer of the heat release board 4, which further facilitates the assembly of the electronic control unit 1.

The multilayer board 2 may have three layers or, five or more layers including the above-described inner power layer.

The heat release device of the present embodiment includes the heat release pin 3 and the heat release board 4. The heat release pin 3 is thermally and electrically connected to the power layer 2B of the multilayer board 2. The heat release board 4 has the heat release layer 4A thermally and electrically connected to the heat release pin 3 and the shield layer 4B for shielding against the electromagnetic noise radiated from the heat release layer 4A. The heat release layer 4A is electrically insulated from the shield layer 4B. The heat release pin 3 is electrically insulated from the shield layer 4B when the heat release pin 3 is connected to the heat release layer 4A. The shield layer 4B is electrically connected to the casing 6 that is grounded. The heat release layer 4A is thermally connected to the casing 6 through the insulator 5.

As described above, the heat release device of the present embodiment allows release of the heat generated in the power layer 2B of the multilayer board 2 and also allows shielding against the electromagnetic noise radiated from the heat release layer 4A of the heat release board 4 electrically connected to the power layer 2B of the multilayer board 2. Furthermore, there is no need to provide an additional cover for shielding against such noise, thereby making it easy to assemble the electronic control unit 1.

It is to be understood that the present invention is not limited to the above-described embodiment, but it may be modified in various ways without departing from the scope of the invention.

What is claimed is:

1. A heat release device for use with a multilayer board that has an inner layer serving as a power layer, comprising:
   a heat release member thermally and electrically connected to the power layer;
   a heat release board having a heat release layer and a shield layer electrically insulated from each other, the heat release layer being thermally and electrically connected to the heat release member, the shield layer serving to shield against electromagnetic noise radiated from the heat release layer, the shield layer being electrically insulated from the heat release member connected to the heat release layer;
   an electrically conductive member electrically connected to the shield layer and a grounded component; wherein the shield layer is provided between an electric component in the multilayer board and the heat release layer; and
   an insulator through which the heat release layer is thermally connected to the electrically conductive member.

2. The heat release device according to claim 1, wherein the insulator is formed as an outer layer of the heat release board.

\* \* \* \* \*